(12) United States Patent
Kaguchi

(10) Patent No.: US 12,302,616 B2
(45) Date of Patent: May 13, 2025

(54) SEMICONDUCTOR DEVICE AND SEMICONDUCTOR MODULE

(71) Applicant: Mitsubishi Electric Corporation, Tokyo (JP)

(72) Inventor: Naoto Kaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 428 days.

(21) Appl. No.: 17/756,019

(22) PCT Filed: Dec. 23, 2019

(86) PCT No.: PCT/JP2019/050304
§ 371 (c)(1),
(2) Date: May 13, 2022

(87) PCT Pub. No.: WO2021/130809
PCT Pub. Date: Jul. 1, 2021

(65) Prior Publication Data
US 2022/0406893 A1    Dec. 22, 2022

(51) Int. Cl.
*H01L 21/71*    (2006.01)
*H10D 62/17*    (2025.01)
*H10D 62/832*    (2025.01)

(52) U.S. Cl.
CPC ....... *H10D 62/393* (2025.01); *H10D 62/8325* (2025.01)

(58) Field of Classification Search
CPC . H01L 29/1095; H01L 29/1608; H01L 22/14; H01L 22/32; H01L 29/7395;
(Continued)

(56) References Cited

U.S. PATENT DOCUMENTS 8,872,245 B2 * 10/2014 Shimatou ............ H01L 29/0619
257/288
9,178,014 B2 * 11/2015 Senoo ................. H01L 29/7395
(Continued)

FOREIGN PATENT DOCUMENTS

DE    112013007220 T5    4/2016
JP    2005-228854 A    8/2005
JP    2010-062331 A    3/2010

OTHER PUBLICATIONS

International Search Report issued in PCT/JP2019/050304; mailed Mar. 17, 2020.
(Continued)

*Primary Examiner* — Vu A Vu
(74) *Attorney, Agent, or Firm* — Studebaker Brackett PLLC

(57) ABSTRACT

An object is to provide a semiconductor device that implements cost reduction as well as determination of withstand voltage characteristics. A semiconductor substrate includes a semiconductor element on the front surface thereof and a back surface electrode on the back surface thereof that controls the operation of the semiconductor element. A first electrode and a second electrode are provided in a terminal region outside an active region in which the semiconductor element is formed. An insulating film is provided between the first electrode and the second electrode. The second electrode is provided on an insulating interlayer film provided on the front surface of the semiconductor substrate. The first electrode is in contact with the front surface of the semiconductor substrate and is provided on the semiconductor substrate closer to an end portion thereof than the second electrode is, and is electrically connected to the back surface electrode.

11 Claims, 7 Drawing Sheets

(58) Field of Classification Search
CPC ............ H01L 29/7802; G01R 31/2608; G01R 31/2621; G01R 31/2644
USPC .......................................................... 257/77
See application file for complete search history.

(56) References Cited

U.S. PATENT DOCUMENTS

| | | | |
|---|---|---|---|
| 9,455,355 B2 * | 9/2016 | Otsuki | H01L 29/0834 |
| 9,530,836 B2 * | 12/2016 | Senoo | H01L 29/7813 |
| 9,768,287 B1 * | 9/2017 | Soeno | H01L 29/45 |
| 9,985,125 B1 * | 5/2018 | Sano | H01L 23/3192 |
| 10,658,466 B2 * | 5/2020 | Uchida | H01L 29/66969 |
| 10,741,651 B2 * | 8/2020 | Liu | H01L 28/20 |
| 10,872,958 B2 * | 12/2020 | Tsuchitani | H01L 29/405 |
| 2005/0194649 A1 | 9/2005 | Oki | |
| 2013/0069694 A1 | 3/2013 | Saito et al. | |
| 2016/0087110 A1 | 3/2016 | Otsuki et al. | |
| 2021/0265491 A1 * | 8/2021 | Soneda | H01L 29/0607 |
| 2022/0085154 A1 * | 3/2022 | Matsushita | H01L 29/41725 |

OTHER PUBLICATIONS

Office Action issued in DE 11 2019 007 994.8; mailed by the German Patent and Trademark Office on Oct. 14, 2024.

An Office Action mailed by China National Intellectual Property Administration on Aug. 5, 2024, which corresponds to Chinese Patent Application No. 201980103124.3 and is related to U.S. Appl. No. 17/756,019; with English language translation.

* cited by examiner

F I G. 4
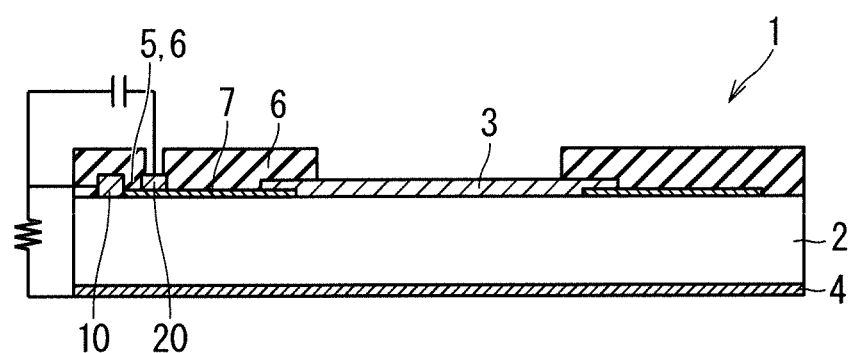
F I G. 5
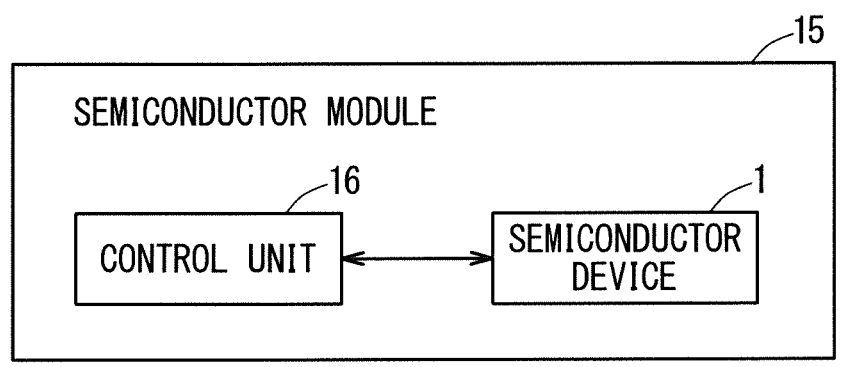

SEMICONDUCTOR DEVICE AND SEMICONDUCTOR MODULE

TECHNICAL FIELD

The present disclosure relates to a semiconductor device and a semiconductor module.

BACKGROUND ART

A power semiconductor device to which a high voltage is applied is required to have a high withstand voltage leak characteristic. The withstand voltage leak characteristic may decrease due to the influence of humidity (moisture). However, malfunctions caused by humidity factor are not found until the main withstand voltage lowers, and is often found as a system error. In the worst case, the decrease in withstand voltage causes the destruction of the power semiconductor device and the system thereof.

Patent Document 1 proposes a semiconductor chip for detecting moisture absorbed in a low-k material or peeling of the low-k material due to the moisture. The semiconductor chip includes a plurality of capacitor electrodes between a guard ring and a circuit element, or outside the guard ring. The semiconductor chip ensures to grasp the damaged part of the guard ring due to moisture or peeling by detecting the change in the capacitance between the capacitor electrodes.

PRIOR ART DOCUMENTS

Patent Documents

[Patent Document 1] Japanese Patent Application Laid-Open No. 2005-228854

SUMMARY

Problem to be Solved by the Invention

When a capacitance is formed in the terminal region, two or more openings are required to be formed as a region for wiring to the two electrodes forming the capacitance. In particular, when a wire is connected to the electrodes, the openings need to have an area corresponding to the wire diameter. Therefore, the size of the semiconductor device increases, leading to a cost increase.

The present disclosure has been made to solve the above-mentioned problems and an object is to provide a semiconductor device that implements cost reduction as well as determination of withstand voltage characteristics.

Means to Solve the Problem

The semiconductor device of the present disclosure includes a semiconductor substrate, a first electrode, a second electrode, and an insulating film. The semiconductor substrate includes a semiconductor element on the front surface thereof and a back surface electrode on the back surface thereof that controls the operation of the semiconductor element. The first electrode and the second electrode are provided in a terminal region being the terminal region formed on the outer peripheral portion of the semiconductor substrate and being the terminal region outside an active region in which the semiconductor element is formed. The insulating film is provided between the first electrode and the second electrode. The second electrode is provided on an insulating interlayer film provided on the front surface of the semiconductor substrate. The first electrode is in contact with the front surface of the semiconductor substrate and is provided on the semiconductor substrate closer to an end portion thereof than the second electrode is, and is electrically connected to the back surface electrode.

Effects of the Invention

According to the present disclosure, the semiconductor device that implements cost reduction as well as determination of the withstand voltage characteristics is provided.

The objects, features, aspects, and advantages of the present disclosure will become more apparent from the following detailed description and the accompanying drawings.

BRIEF DESCRIPTION OF DRAWINGS

FIG. 4 A diagram illustrating a cross section of the configuration illustrated in FIG. 3 and an electric circuit.

FIG. 5 A block diagram illustrating a configuration of a semiconductor module according to the first embodiment.

DESCRIPTION OF EMBODIMENT(S)

First Embodiment

Figure 1:
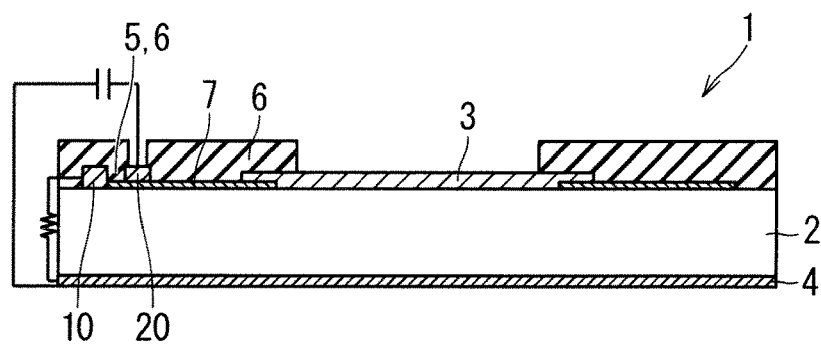
FIG. 1 A cross-sectional view illustrating a configuration of a semiconductor device according to the first embodiment.
Figure 2:
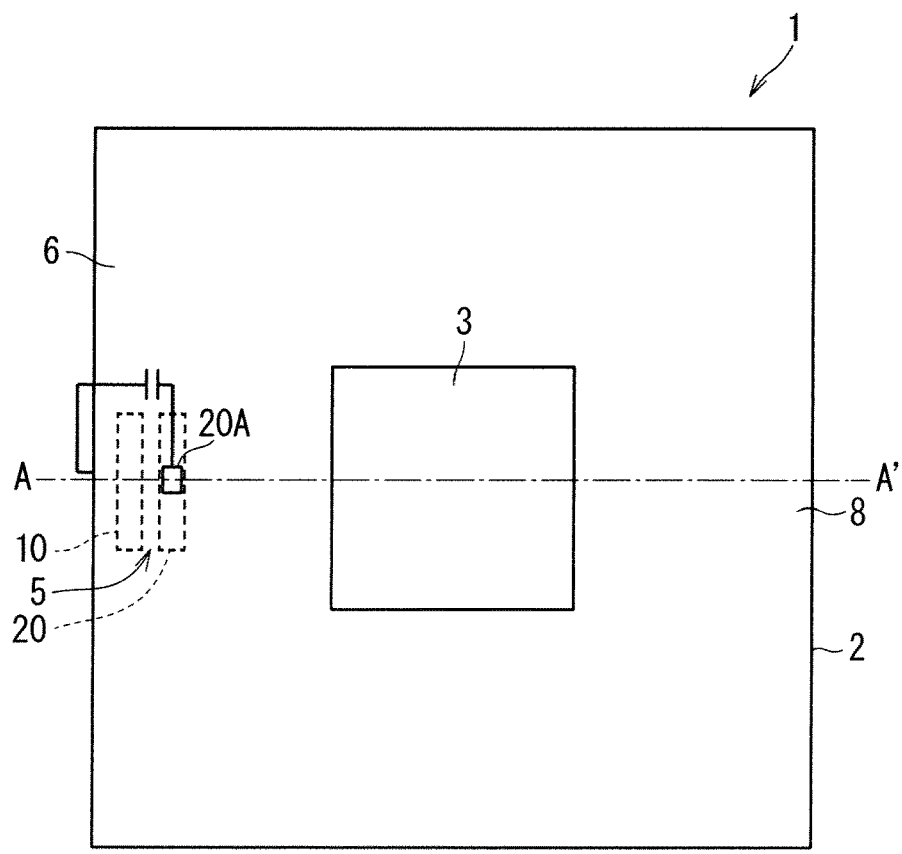
FIG. 2 A plan view illustrating the configuration of the semiconductor device according to the first embodiment.
Figure 3:
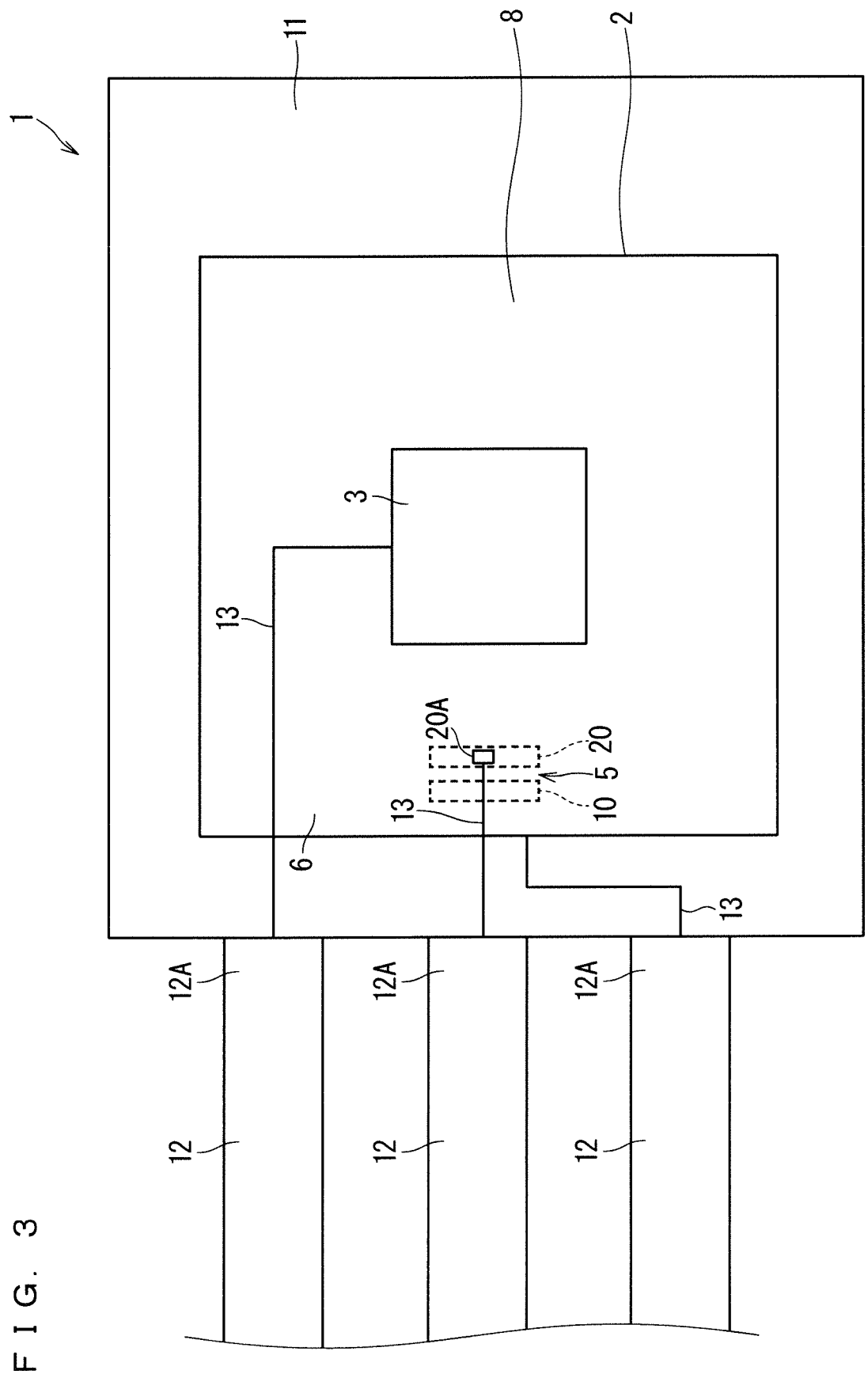
FIG. 3 A plan view illustrating an example of the configuration of a packaged semiconductor device.

FIGS. 1 and 2 are a cross-sectional view and a plan view illustrating a configuration of a semiconductor device according to the first embodiment, respectively. FIG. 1 illustrates a cross section at A-A' illustrated in FIG. 2. FIG. 3 is a plan view illustrating an example of the configuration of a packaged semiconductor device 1.

The semiconductor device 1 includes a semiconductor substrate 2, a semiconductor element (not illustrated), a front surface electrode 3, a back surface electrode 4, a first electrode 10, a second electrode 20, an insulating film 5, a protective film 6, a sealing material 11, and an electrode terminals 12.

The semiconductor element is provided on the front surface of the semiconductor substrate 2 which is a surface below the front surface electrode 3. The semiconductor element is made of, for example, a semiconductor such as Si or a so-called wide bandgap semiconductor such as SiC or GaN. The semiconductor element is, for example, an Insulated Gate Bipolar Transistor (IGBT), a Metal Oxide Semiconductor Field Effect Transistor (MOSFET), a diode or the like. The semiconductor element is, for example, a power semiconductor element. The semiconductor substrate 2 and the semiconductor element in the first embodiment are made of a wide bandgap semiconductor.

The surface electrode 3 is provided on the front surface of the semiconductor substrate 2 corresponding to the active region in which the semiconductor element is formed. The surface electrode 3 controls the operation of the semiconductor element. The operation is, for example, a switching operation of an IGBT, a MOSFET, or the like.

The back surface electrode 4 is provided on the back surface of the semiconductor substrate 2. The back surface electrode 4 controls the operation of the semiconductor element. When the semiconductor device is an IGBT, the front surface electrode 3 includes two electrode pads (not illustrated) connected to a gate electrode and an emitter electrode, respectively, and the back surface electrode 4 corresponds to an electrode pad connected to a collector electrode. When the semiconductor element is a MOSFET, the front surface electrode 3 includes two electrode pads (not illustrated) connected to a gate electrode and a source electrode, respectively, and the back surface electrode 4 corresponds to an electrode pad connected to a drain electrode. When the semiconductor element is a diode, the front surface electrode 3 is an electrode pad connected to an anode, and the back surface electrode 4 is an electrode pad connected to a cathode.

A first electrode 10 and a second electrode 20 are provided in a terminal region 8 outside an active region in which the semiconductor element is formed. The terminal region 8 is formed on the outside of the front surface electrode 3, that is, on the outer peripheral portion of the semiconductor substrate 2. The second electrode 20 is provided on an insulating interlayer film 7 provided on the front surface of the semiconductor substrate 2. The first electrode 10 is in contact with the front surface of the semiconductor substrate 2 and is provided on the semiconductor substrate 2 closer to an end portion thereof than the second electrode 20 is. The first electrode 10 may be provided on the front surface of the semiconductor substrate 2 via a contact electrode (not illustrated) provided on the front surface of the semiconductor substrate 2. The first electrode 10 is preferably provided in the vicinity of the end portion (end surface) of the semiconductor substrate 2. The first electrode 10 and the second electrode 20 are separated from the surface electrode 3 and the semiconductor element to such an extent that they do not affect the operation of the semiconductor element. That is, the first electrode 10 and the second electrode 20 are independent. The first electrode 10 is electrically connected to the back surface electrode 4 via a minute resistance on the end surface of the semiconductor substrate 2. Further, the first electrode 10 and the second electrode 20 in the first embodiment are made of the same material as that of the front surface electrode 3. The first electrode 10, the second electrode 20, and the front surface electrode 3 are made of, for example, Al, AlSi, or the like.

As illustrated in FIG. 3, the first electrode 10 and the second electrode 20 are provided in a region of the outer peripheral portion of the semiconductor substrate 2, where the electrode terminals 12 are located in a direction protruding to the outside. In other words, the first electrode 10 and the second electrode 20 are provided on the base end portions 12A side of the electrode terminals 12 in the outer peripheral portion of the semiconductor substrate 2.

The insulating film 5 is provided between the first electrode 10 and the second electrode 20. The first electrode 10, the second electrode 20, and the insulating film 5 form a capacitive structure in the terminal region 8. The capacitance varies depending on a degree of moisture absorption of the insulating film 5.

The protective film 6 has an insulating property and covers the front surface of the semiconductor substrate 2. The protective film 6 has two openings. A part 20A of second electrode 20 and the front surface electrode 3 are exposed from the two openings, respectively. On the other hand, the first electrode 10 is covered with the protective film 6, and the first electrode 10 is not exposed. The insulating film 5 and the protective film 6 in the first embodiment are made of the same material. For example, the insulating film 5 and the protective film 6 are made of polyimide.

The sealing material 11 seals the structure illustrated in FIG. 1, that is, the structure including the semiconductor substrate 2, the first electrode 10, the second electrode 20, the insulating film 5, and the like. The semiconductor device 1 in the first embodiment is packaged by the sealing material 11, and the package is a resin-sealed mold package. However, the package is not limited to this configuration, and a configuration in which the semiconductor substrate 2 or the like housed in the case is sealed may be adopted.

The electrode terminals 12 are connected to any one of the second electrode 20, the front surface electrode 3 and the back surface electrode 4 inside the sealing material 11. Although the detailed structure of internal wiring 13 inside the sealing material 11 is not illustrated in FIG. 3, for example, one end of the electrode terminal 12 located at the center in FIG. 3 is connected to the part 20A of second electrode 20 via the internal wiring 13 such as a wire. Similarly, one end of the electrode terminal 12 located on lower side in FIG. 3 is connected to the back surface electrode 4 via the internal wiring 13. The other end of each electrode terminal 12 projects to the outside of the sealing material 11. The other ends are connectable to an external circuit, and are connected to, for example, a control unit 16 described later. FIG. 4 is a diagram illustrating a cross section of the configuration illustrated in FIG. 3 and an electric circuit. The first electrode 10 is connected to the back surface electrode 4 via a minute resistance on the end surface of the semiconductor substrate 2.

FIG. 5 is a block diagram illustrating a configuration of a semiconductor module 15 according to the first embodiment. The semiconductor module 15 includes the above-mentioned semiconductor device 1 and the control unit 16.

Figure 6:
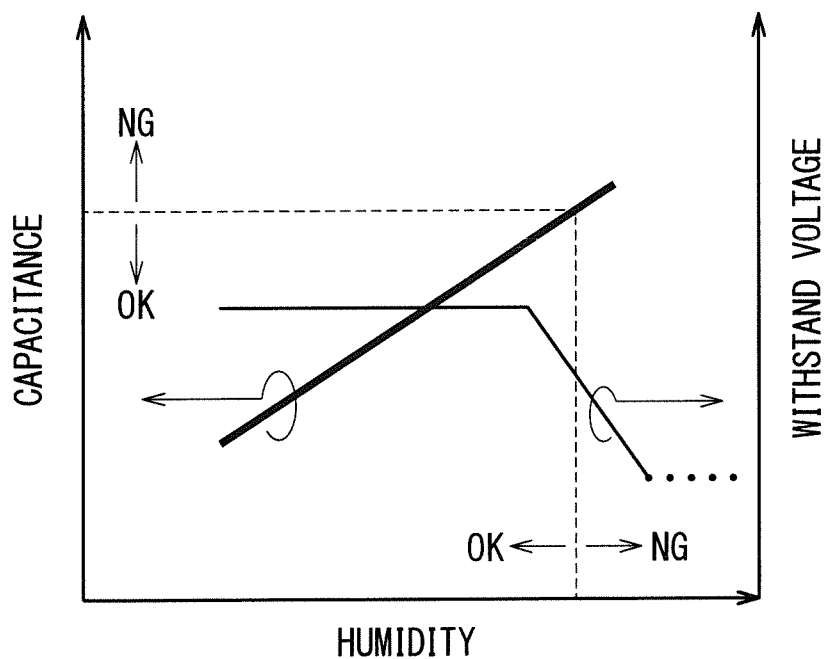
FIG. 6 A graph illustrating an example of the relationship between the capacitance and the withstand voltage of the semiconductor device with respect to humidity.

The control unit 16 stores in advance the relationship of the capacitance between the first electrode 10 and the second electrode 20 with respect to humidity and the relationship of the withstand voltage of the semiconductor device 1 with respect to humidity, respectively, in a memory or the like. FIG. 6 is a graph illustrating an example of the relationship between the capacitance and the withstand voltage of the semiconductor device 1 with respect to humidity. The control unit 16 determines the humidity at which the withstand voltage function of the semiconductor device 1 is lost, based on the relationship of the withstand voltage of the semiconductor device 1 with respect to humidity. Then, the control unit 16 sets the capacitance at the humidity at which the withstand voltage function is lost as a threshold value based on the relationship of the capacitance between the first electrode 10 and the second electrode 20 with respect to the humidity. Based on the threshold value and the detection capacitance between the first electrode 10 and the second electrode 20 obtained by applying a voltage between the second electrode 20 and the back surface electrode 4, the control unit 16 determines the withstand voltage function of the semiconductor device 1. For example, the control unit 16 outputs an error before the detection capacitance exceeds the threshold value, that is, when the detection capacitance indicates a value within a predetermined range from the threshold value.

The function of the control unit 16 is implemented by a processing circuit (not illustrated). The processing circuit includes, for example, a processor and a memory. The function of the control unit 16 is implemented by the processor executing the program stored in the memory.

Figure 7:
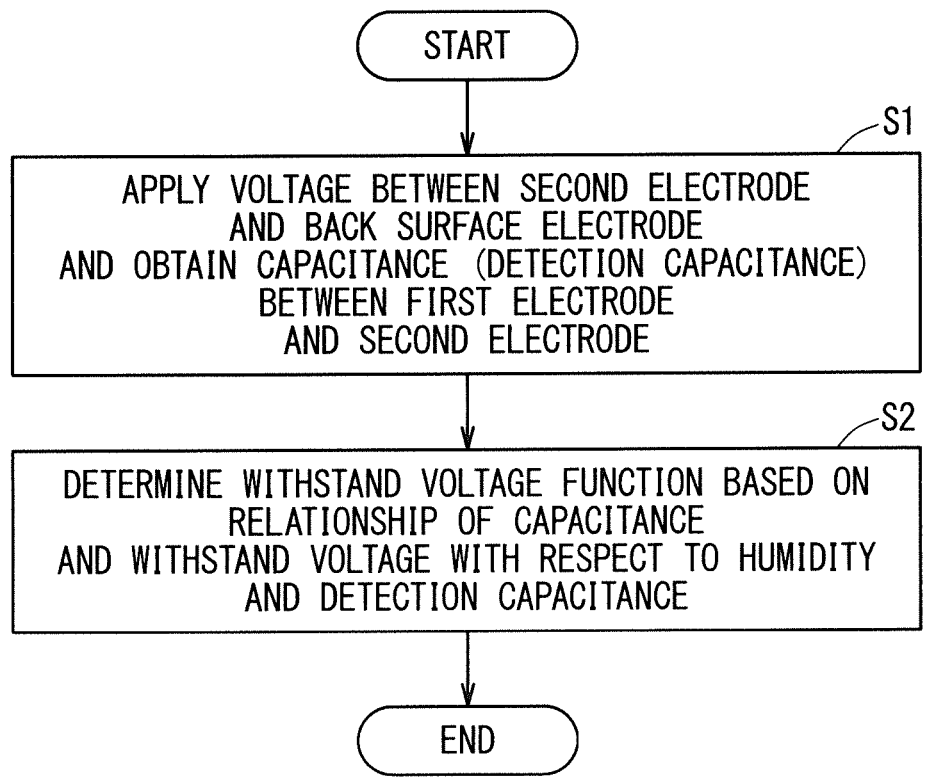
FIG. 7 A flowchart illustrating a measurement method of the withstand voltage characteristic of the semiconductor device according to the first embodiment.

Next, a measurement method of the withstand voltage characteristic of the semiconductor device 1 by the control unit 16 of the semiconductor module 15 will be described. FIG. 7 is a flowchart illustrating a measurement method of the withstand voltage characteristic of the semiconductor device 1 according to the first embodiment.

In Step S1, the control unit 16 applies a voltage between the second electrode 20 and the back surface electrode 4. The voltage is applied, for example, through the electrode terminal 12 connected to the second electrode 20 and the electrode terminal 12 connected to the back surface electrode 4. The first electrode 10 is electrically connected to the back surface electrode 4 via the minute resistance on the end surface of the semiconductor substrate 2; therefore, the first electrode 10 and the back electrode 4 are short-circuited when excluding the voltage drop due to the minute resistance. That is, potentials of both can be regarded as the same (common potential). The control unit 16 regards that the first electrode 10 and the back surface electrode 4 have the same potential, and obtains the capacitance (detection capacitance) between the first electrode 10 and the second electrode 20. Alternatively, even in a case where other resistance or capacitance is included between the first electrode 10 and the back surface electrode 4, those resistance and capacitance are predetermined as design values of the semiconductor device 1. The control unit 16 obtains the capacitance (detection capacitance) between the first electrode 10 and the second electrode 20 based on the result of applying a voltage between the second electrode 20 and the back surface electrode 4 and the design values.

The capacitance measurement is performed in a state where the semiconductor device 1 is not operating. Although capacitance measurement can be performed even when the semiconductor device 1 is not packaged, the semiconductor device 1 is preferably in a packaged state when the capacitance measurement is performed because the intrusion direction and the degree of intrusion of moisture are crucial parameters related to the withstand voltage characteristics.

In Step S2, based on the relationship of the capacitance between the first electrode 10 and the second electrode 20 and the withstand voltage of the semiconductor device 1 with respect to humidity (FIG. 6), and the detection capacitance between the first electrode 10 and the second electrode 20, the control unit 16 determines the withstand voltage function of the semiconductor device 1. Here, the control unit 16 outputs an error before the detection capacitance exceeds the threshold value, that is, when the detection capacitance indicates a value within a predetermined range from the threshold value. The error indicates a state in which moisture has intruded into the package and the withstand voltage function of the semiconductor device 1 cannot be secured. The error is output before the detection capacitance exceeds the threshold value; therefore, the semiconductor device 1 is prevented from being destroyed.

Summarizing the above, the semiconductor device 1 in the first embodiment includes the semiconductor substrate 2, the first electrode 10, the second electrode 20, and the insulating film 5. The semiconductor substrate 2 includes a semiconductor element on the front surface thereof and a back surface electrode 4 on the back surface thereof that controls the operation of the semiconductor element. The first electrode 10 and the second electrode 20 are provided in the terminal region 8 formed on the outer peripheral portion of the semiconductor substrate 2. The terminal region 8 is located outside the active region in which the semiconductor element is formed. The insulating film 5 is provided between the first electrode 10 and the second electrode 20. The second electrode 20 is provided on the insulating interlayer film 7 provided on the front surface of the semiconductor substrate 2. The first electrode 10 is in contact with the front surface of the semiconductor substrate 2 and is provided on the semiconductor substrate 2 closer to an end portion thereof than the second electrode 20 is. The first electrode 10 is electrically connected to the back surface electrode 4.

Further, the semiconductor device 1 in the first embodiment includes the insulating protective film 6 that covers the front surface of the semiconductor substrate 2. The part 20A of second electrode 20 is exposed from the opening of the protective film 6. The first electrode 10 is covered with the protective film 6.

With such a configuration, the capacitance between the first electrode 10 and the second electrode 20 is detected by the applying of a voltage between the second electrode 20 and the back surface electrode 4. The capacitance is monitored as appropriate, and the intrusion status of moisture is determined based on the fluctuation of the capacitance. When determined that the intrusion of moisture is excessive, for example, preventive measures such as stopping the semiconductor device 1 or the system in which the semiconductor device 1 is used are taken. The semiconductor device 1 is prevented from being destroyed, leading to improvement of reliability. Further, the voltage for capacitance measurement is applied between the second electrode 20 and the back surface electrode 4. Therefore, the semiconductor device 1 does not require an opening for connecting the internal wiring to the first electrode 10. Further, wiring for connecting the first electrode 10 and the back surface electrode 4 is also not required. As a result, the size of the semiconductor device 1 is reduced and the cost is reduced. As described above, the semiconductor device 1 in the first embodiment realizes cost reduction as well as determination of the withstand voltage characteristic.

Further, the first electrode 10, the second electrode 20, and the front surface electrode 3 of the semiconductor device 1 in the first embodiment are made of the same material. Further, the insulating film 5 and the protective film 6 are made of the same material.

With such a configuration, the first electrode 10, the second electrode 20, and the front surface electrode 3 are manufactured by the same process. Similarly, the insulating film 5 and the protective film 6 are manufactured by the same process. Therefore, the manufacturing thereof can be reduced.

The semiconductor device 1 in the first embodiment includes the sealing material 11 and the electrode terminals 12. The sealing material 11 seals the semiconductor substrate 2, the first electrode 10, the second electrode 20, and the insulating film 5. One end of the electrode terminal 12 is connected to any one of the second electrode 20, the back surface electrode 4, and the front surface electrode 3 inside the sealing material 11, and the other end thereof protrudes to the outside of the sealing material 11. The first electrode 10 and the second electrode 20 are provided on the base end portions 12A side which is the side the electrode terminals 12 protrude from the sealing material, in the outer peripheral portion of the semiconductor substrate 2.

Moisture easily intrudes the inside of the sealing material 11 from the base end portions 12A of the electrode terminals 12. By providing the first electrode 10 and the second electrode 20 forming the capacitance in the direction of the base end portions 12A of the electrode terminals 12, the sensitivity of detecting moisture is improved.

The semiconductor substrate 2 in the first embodiment is made of a wide bandgap semiconductor.

The first electrode 10 and the second electrode 20 are made of metal, therefore, the electric field strength is required to be meticulously designed when the first electrode 10 and the second electrode 20 are provided in the terminal region 8. Depending on the structure of the first electrode 10 and the second electrode 20, the function of the semiconductor device 1 may deteriorate, leading to the deterioration of quality. When taking manufacturing variations into consideration, a terminal structure with a margin secured in advance is required to be designed. When the semiconductor substrate 2 in the first embodiment is made of a wide bandgap semiconductor (SiC, GaN, etc.), even if the electric field strength inside the semiconductor substrate 2 is increased by the second electrode 20, the influence is small. This makes the design simple, leading to cost reduction.

The semiconductor module 15 in the first embodiment includes the above-mentioned semiconductor device 1 and the control unit 16. Based on the relationship of the capacitance between the first electrode 10 and the second electrode 20 and the withstand voltage of the semiconductor device 1 with respect to humidity and the detection capacitance between the first electrode 10 and the second electrode 20 obtained by applying a voltage between the second electrode 20 and the back surface electrode 4, the control unit 16 determines the withstand voltage function of the semiconductor device 1.

Such a semiconductor module 15 outputs an error based on a predetermined criterion set in advance for the detection capacitance. An error is output before the withstand voltage function of the semiconductor device 1 cannot be secured, the reliability of the semiconductor device 1 is improved.

Modification of First Embodiment

Figure 8:
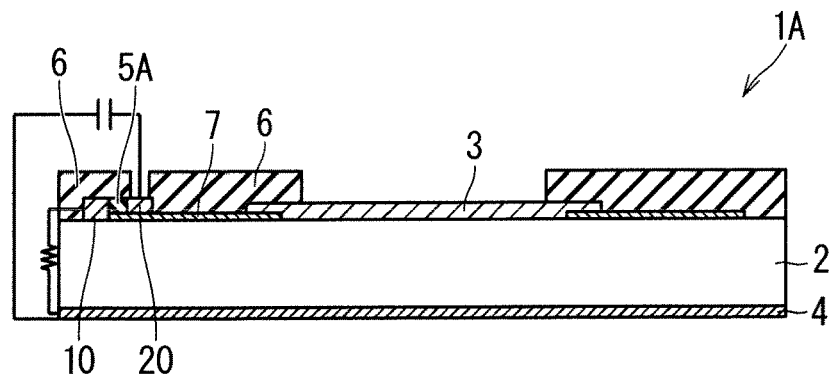
FIG. 8 A cross-sectional view illustrating a configuration of a semiconductor device according to the modification of the first embodiment.
Figure 9:
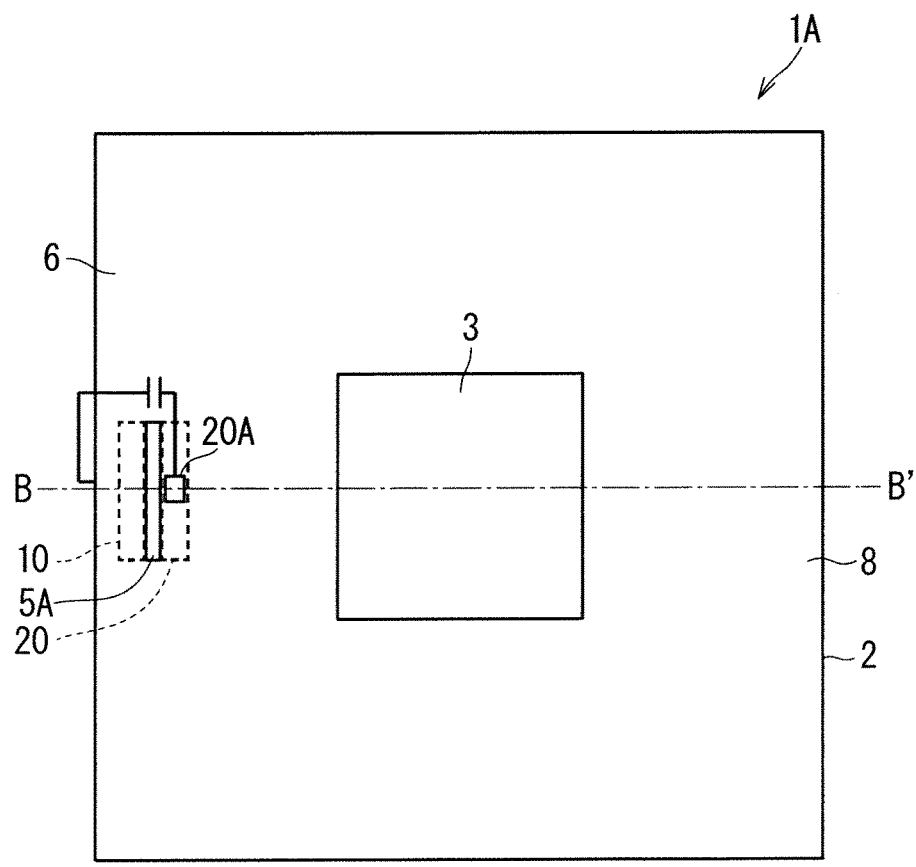
FIG. 9 A plan view illustrating the configuration of the semiconductor device according to the modification of the first embodiment.

FIGS. 8 and 9 are a cross-sectional view and a plan view illustrating a configuration of a semiconductor device according to the modification of the first embodiment, respectively. FIG. 8 illustrates a cross section at B-B' illustrated in FIG. 9.

An insulating film 5A and the protective film 6 in the modification of the first embodiment are made of the same material. The insulating film 5A is made of a material containing, for example, any of $CaF_2$, $Al_2O_3$ and $Si_3N_4$. The protective film 6 is made of polyimide.

The normal capacitance is adjusted by selecting the material of the insulating film 5A. In other words, the detection sensitivity of the capacitance change due to humidity is adjusted by the material selection. As a result, malfunctions such as excessive detection are prevented.

Second Embodiment

A semiconductor device and a semiconductor module according to the second embodiment will be described. The second embodiment is a subordinate concept of the first embodiment, and the semiconductor device in the second embodiment includes each configuration of the semiconductor device 1 in the first embodiment. The description of the same configuration and operation as in the first embodiment will be omitted.

Figure 10:
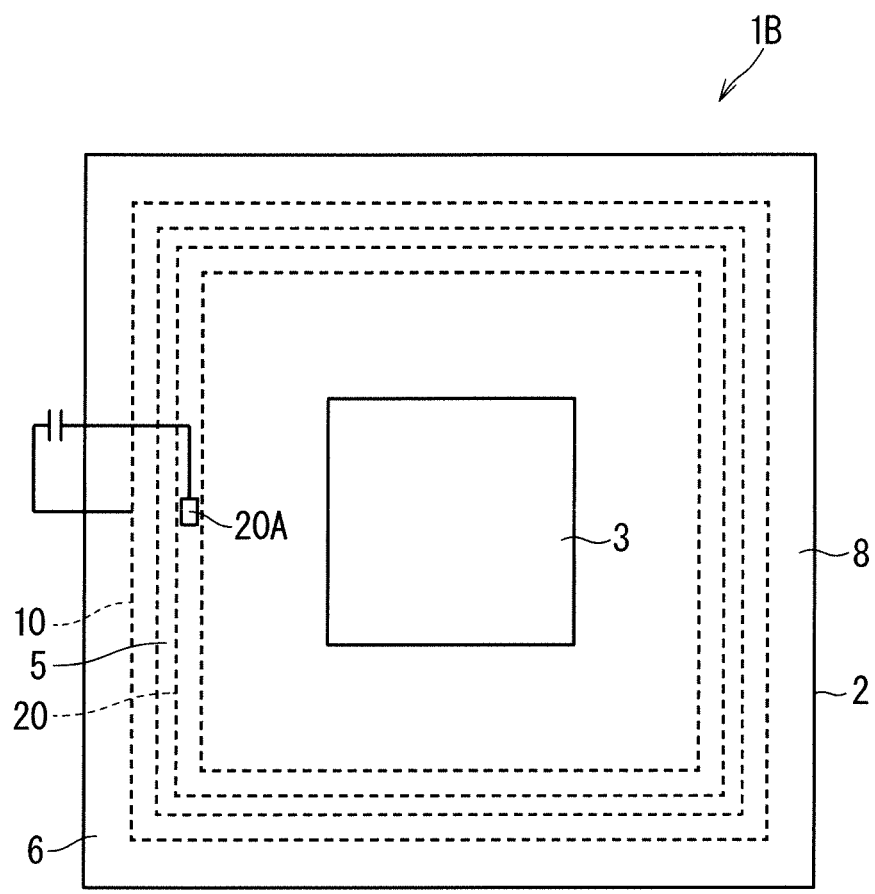
FIG. 10 A plan view illustrating a configuration of a semiconductor device according to the second embodiment.

FIG. 10 is a plan view illustrating the configuration of the semiconductor device 1B according to the second embodiment. The first electrode 10 and the second electrode 20 are provided in an annular shape along the outer peripheral portion of the semiconductor substrate 2. In other words, the first electrode 10 and the second electrode 20 are arranged on the entire outer peripheral portion.

With such a configuration, the cross-sectional area that determines the capacitance between the first electrode 10 and the second electrode 20 increases. The cross-sectional area is determined by the product of the film thickness of the first electrode 10 or the second electrode 20 and the length of the first electrode 10 or the second electrode 20. The capacitance C is represented by $C=\varepsilon \times S/d$, where the permittivity of the insulating film 5 is $\varepsilon$, the cross-sectional area is S, and the distance between the first electrode 10 and the second electrode 20 is d. By arranging the first electrode 10 and the second electrode 20 on the entire outer peripheral portion of the semiconductor substrate 2, the cross-sectional area S increases and the capacitance C increases. As a result, the detection sensitivity increases.

Further, depending on the cross-sectional area S and the distance d, the semiconductor device 1B having the detection sensitivity according to the application can be designed. The detection sensitivity is adjusted as needed; therefore, malfunctions such as excessive detection are prevented. For example, the film thicknesses of the first electrode 10 and the second electrode 20 preferably take values that satisfy ±50% of the film thickness of the surface electrode 3. The distance between the first electrode 10 and the second electrode 20 is preferably one-third or less of the width of the terminal region 8.

Modification of Second Embodiment

Figure 11:
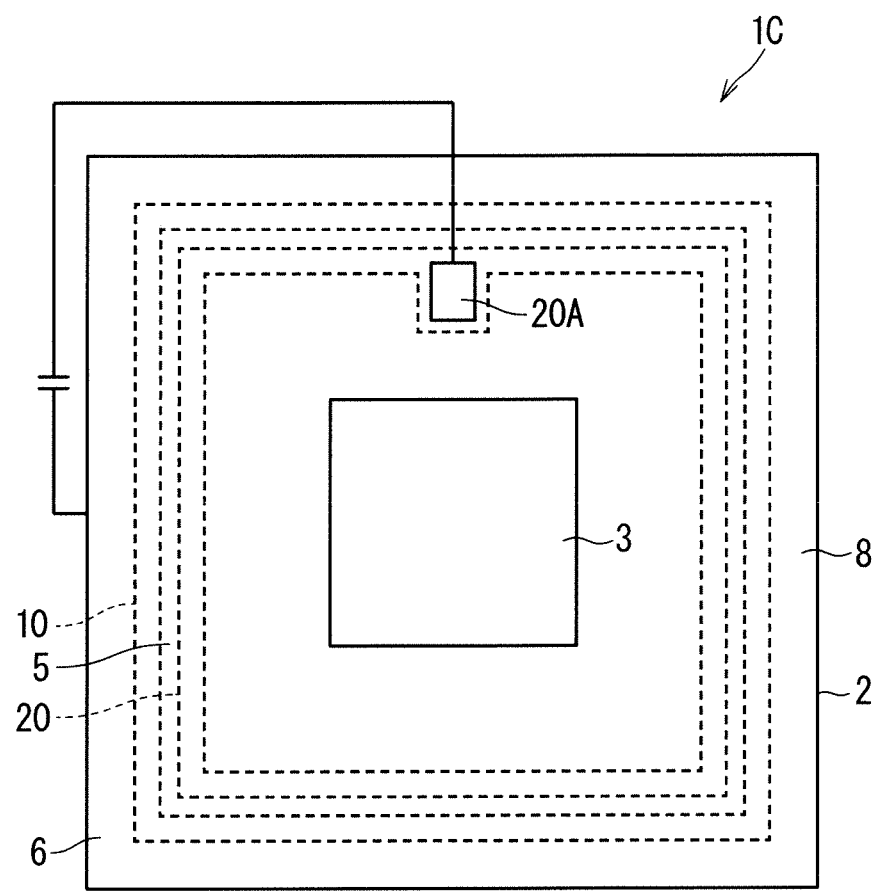
FIG. 11 A plan view illustrating a configuration of a semiconductor device according to the modification of the second embodiment.

FIG. 11 is a plan view illustrating the configuration of the semiconductor device 1C according to the modification of the second embodiment. The part 20A of second electrode 20 connected to the electrode terminal 12 does not need to be provided on the base end portion 12A side of the electrode terminal 12. The size of the area is set arbitrarily. Even in that case, the same effect as described above is obtained.

In the present disclosure, the embodiments can be combined, appropriately modified or omitted, without departing from the scope of the invention.

While the disclosure has been shown and described in detail, the foregoing description is in all aspects illustrative and not restrictive. It is understood that numerous other modifications not having been described can be devised without departing from the scope of the invention.

EXPLANATION OF REFERENCE SIGNS 1 semiconductor device, 1A semiconductor device, 1B semiconductor device, 1C semiconductor device, 2 semiconductor substrate, 3 front surface electrode, 4 back surface electrode, 5 insulating film, 5A insulating film, 6 protective film, 7 interlayer film, 8 terminal region, 10 first electrode, 11 sealing material, 12 electrode terminal, 12A base end

The invention claimed is:

1. A semiconductor device comprising:
a semiconductor substrate including a semiconductor element on a front surface thereof and a back surface electrode on a back surface thereof that controls operation of the semiconductor element;
a first electrode and a second electrode provided in a terminal region being the terminal region formed on an outer peripheral portion of the semiconductor substrate and being the terminal region outside an active region in which the semiconductor element is formed;
an insulating film provided between the first electrode and the second electrode; and
an electrical connection external to the semiconductor substrate that electrically connects the first electrode to the back surface electrode, wherein
the second electrode is provided on an insulating interlayer film provided on the front surface of the semiconductor substrate, and
the first electrode is in contact with the front surface of the semiconductor substrate and is provided on the semiconductor substrate closer to an end portion thereof than the second electrode is.

2. The semiconductor device according to claim 1, wherein
the insulating film contains any of $CaF_2$, $Al_2O_3$ and $Si_3N_4$.

3. The semiconductor device according to claim 1, further comprising
a protective film having an insulating property and covering the front surface of the semiconductor substrate, wherein
the first electrode is covered with the protective film, and
a part of the second electrode is exposed from an opening of the protective film.

4. The semiconductor device according to claim 3, wherein
the first electrode, the second electrode, and a front surface electrode controlling the operation of the semiconductor element provided on the front surface of the semiconductor substrate are made of a same material, and
the insulating film and the protective film are made of a same material.

5. The semiconductor device according to claim 1, further comprising:
a sealing material sealing the semiconductor substrate, the first electrode, the second electrode, and the insulating film; and
an electrode terminal having one end thereof connected to any of the second electrode, the back surface electrode, and a front surface electrode controlling the operation of the semiconductor element provided on the front surface of the semiconductor substrate inside the sealing material, and an other end thereof projecting to the outside of the sealing material, wherein
the first electrode and the second electrode are provided on a base end portion side which is a side the electrode terminal protrudes from the sealing material, in the outer peripheral portion of the semiconductor substrate.

6. The semiconductor device according to claim 1, wherein
the first electrode and the second electrode are provided in an annular shape along the outer peripheral portion of the semiconductor substrate.

7. The semiconductor device according to claim 1, wherein
the semiconductor substrate is made of a wide bandgap semiconductor.

8. A semiconductor module comprising:
the semiconductor device according to claim 1; and
a control unit configured to determine a withstand voltage function of the semiconductor element based on a relationship of a capacitance between the first electrode and the second electrode and a withstand voltage of the semiconductor element with respect to humidity and a detection capacitance between the first electrode and the second electrode obtained by applying a voltage between the second electrode and the back surface electrode.

9. The semiconductor device according to claim 1, wherein
the electrical connection includes a minute resistance external to the semiconductor substrate.

10. The semiconductor device according to claim 1, wherein
the second electrode is provided on the insulating interlayer film provided on the front surface of the semiconductor substrate such that the second electrode is electrically insulated from the front surface of the semiconductor substrate.

11. A semiconductor module comprising:
a semiconductor substrate including a semiconductor element on a front surface thereof and a back surface electrode on a back surface thereof that controls operation of the semiconductor element;
a first electrode and a second electrode provided in a terminal region being the terminal region formed on an outer peripheral portion of the semiconductor substrate and being the terminal region outside an active region in which the semiconductor element is formed;
an insulating film provided between the first electrode and the second electrode; and
a control unit configured to determine a withstand voltage function of the semiconductor element based on a relationship of a capacitance between the first electrode and the second electrode and a withstand voltage of the semiconductor element with respect to humidity and a detection capacitance between the first electrode and the second electrode obtained by applying a voltage between the second electrode and the back surface electrode, wherein
the second electrode is provided on an insulating interlayer film provided on the front surface of the semiconductor substrate, and
the first electrode is in contact with the front surface of the semiconductor substrate and is provided on the semiconductor substrate closer to an end portion thereof than the second electrode is, and is electrically connected to the back surface electrode.

* * * * *